US011071199B2

(12) United States Patent
Chiang et al.

(10) Patent No.: US 11,071,199 B2
(45) Date of Patent: Jul. 20, 2021

(54) OPTICAL PRINTED CIRCUIT BOARD AND ITS FABRICATION METHOD

(71) Applicant: City University of Hong Kong, Kowloon (HK)

(72) Inventors: Kin Seng Chiang, Kowloon (HK); Kar Pong Lor, Ap Lei Chau (HK); Wei Jin, New Territories (HK); Hau Ping Chan, Shatin (HK)

(73) Assignee: City University of Hong Kong, Kowloon (HK)

( * ) Notice: Subject to any disclaimer, the term of this patent is extended or adjusted under 35 U.S.C. 154(b) by 70 days.

(21) Appl. No.: 16/154,933

(22) Filed: Oct. 9, 2018

(65) Prior Publication Data

US 2020/0113045 A1    Apr. 9, 2020

(51) Int. Cl.
*H05K 1/02* (2006.01)
*G02B 6/122* (2006.01)
(Continued)

(52) U.S. Cl.
CPC .......... *H05K 1/0274* (2013.01); *G02B 6/122* (2013.01); *G02B 6/43* (2013.01); *G02B 6/138* (2013.01)

(58) Field of Classification Search
CPC .... G02B 6/122; G02B 6/3885; G02B 6/3807; G02B 6/3897; G02B 6/43; G02B 6/10;
(Continued)

(56) References Cited

U.S. PATENT DOCUMENTS 8,285,087 B2    10/2012  Kim et al.
8,306,374 B2    11/2012  Pitwon et al.
(Continued)

FOREIGN PATENT DOCUMENTS

CN    103529514    1/2014
CN    103630986    3/2014
(Continued)

OTHER PUBLICATIONS

I. Papakonstantinou, et al, "Low-cost, precision, self-alignment technique for coupling laser and photodiode arrays to polymer waveguide arrays on multilayer PCBs," IEEE Trans. Adv. Packag., vol. 31, pp. 502-511, Aug. 2008.
(Continued)

*Primary Examiner* — Michael P Mooney
(74) *Attorney, Agent, or Firm* — Renner Kenner Greive Bobak Taylor & Weber

(57) ABSTRACT

An optical printed circuit board and its fabrication method. The optical printed circuit board includes an electrical conductor arranged for conducting electric signal, an optical waveguide arranged for transmitting optical signal, and an optical waveguide coupling interface arranged at an end of the optical waveguide. The optical waveguide coupling interface is arranged for engagement with an external optical device to optically couple the external optical device with the optical waveguide. The optical waveguide coupling interface includes a first engagement mechanism with a socket defining a space for receiving with a corresponding plug on the external optical device or a plug arranged to be received in a corresponding socket on the external optical device.

27 Claims, 7 Drawing Sheets

(51) Int. Cl.
*G02B 6/43* (2006.01)
*G02B 6/138* (2006.01)

(58) Field of Classification Search
CPC ...... G02B 6/3825; G02B 6/36; G02B 6/4201; G02B 6/4249; H05K 1/0274; H05K 1/0275; H05K 1/187
USPC .................................................. 385/14, 129
See application file for complete search history.

(56) References Cited

U.S. PATENT DOCUMENTS

| | | | |
|---|---|---|---|
| 8,488,920 B2 | 7/2013 | Pitwon | |
| 8,867,871 B2 | 10/2014 | Choi | |
| 9,052,480 B2 | 6/2015 | Yabre et al. | |
| 2006/0098914 A1* | 5/2006 | Tourne | G02B 6/3825 385/14 |
| 2012/0114280 A1 | 5/2012 | Pitwon | |
| 2013/0286676 A1 | 10/2013 | Kim et al. | |
| 2015/0003778 A1 | 1/2015 | Ha | |

FOREIGN PATENT DOCUMENTS

| | | |
|---|---|---|
| CN | 103926647 | 7/2014 |
| CN | 104570210 | 4/2015 |
| EP | 0745873 | 9/1999 |
| WO | 2015/157980 | 10/2015 |

OTHER PUBLICATIONS

R. C. A. Pitwon, et al, "Pluggable Electro-Optical Circuit Board Interconnect Based on Embedded Graded-Index Planar Glass Waveguides," IEEE J. Lightwave Technol., vol. 33, pp. 741-754, Feb. 2015.

R. Kraehenbuehl, et al, "High-precision, self-aligned, optical fiber connectivity solution for single-mode waveguides embedded in optical PCBs," IEEE J. Lightwave Technol., vol. 33, pp. 865-871, Feb. 2015.

G. Jiang, et al, "Flexible polymer waveguides with integrated mirrors fabricated by soft lithography for optical interconnection," IEEE J. Lightwave Technol., vol. 31, pp. 1835-1841, Jun. 2013.

* cited by examiner

OPTICAL PRINTED CIRCUIT BOARD AND ITS FABRICATION METHOD

TECHNICAL FIELD

The invention relates to an optical printed circuit board and its fabrication method.

BACKGROUND

Conventional printed circuit board (PCB) is a dielectric board with copper traces to provide electrical connection and mechanical support for electronic components in electrical appliances. In recent years, the demand for high-speed data transmission (e.g., >10 Gb/s) on PCBs for applications such as ultra-high speed computing systems and high-resolution video-on-demand is growing rapidly. At a data rate in the order of Gb/s, copper traces on conventional PCBs suffer from several fundamental problems, including signal loss, electromagnetic interference, crosstalk, etc.

SUMMARY OF THE INVENTION

It is an object of the invention to address the above needs, to overcome or substantially ameliorate the above disadvantages or, more generally, to provide an optical printed circuit board that is easy to fabricate and can provide improved operation effectiveness. Another object of the invention is to provide a method to facilitate production of an optical printed circuit board.

In accordance with a first aspect of the invention, there is provided an optical printed circuit board, comprising: an electrical conductor arranged for conducting electric signal; an optical waveguide arranged for transmitting optical signal; and an optical waveguide coupling interface arranged at an end of the optical waveguide, the optical waveguide coupling interface being arranged for engagement with an external optical device to optically couple the external optical device with the optical waveguide; wherein the optical waveguide coupling interface comprises a first engagement mechanism with: a socket defining a space for receiving with a corresponding plug on the external optical device; or a plug arranged to be received in a corresponding socket on the external optical device. External optical device can be any optical elements, components, apparatus, etc.

The space or the plug may be generally cylindrical. In one example, the space or the plug extends in parallel with a corresponding end portion of the optical waveguide.

Preferably, the optical waveguide coupling interface comprises a guide member for defining the socket or the plug.

The guide member may have a tubular body that defines the socket. The tubular body may extend in the optical printed circuit board. The tubular body is preferably metallic.

Alternatively, the guide member may have a cylindrical body that defines the plug. The cylindrical body may extend in and projects from the optical printed circuit board. The cylindrical body is preferably metallic. In one example, the cylindrical body may be formed by a tubular member filled with materials.

Preferably, the optical waveguide coupling interface further comprises a second engagement mechanism with: a further socket defining a space for receiving with a corresponding plug on the external optical device; or a further plug arranged to be received in a corresponding socket on the external optical device. The first engagement mechanism and the second engagement mechanism may be arranged on opposite sides of the optical waveguide.

In one embodiment, the optical printed circuit board includes a body, the conductor is arranged on or embedded in the body, and the optical waveguide is embedded in the body. Preferably, the body includes a hole, and the optical waveguide coupling interface is arranged in the hole.

The optical waveguide may comprise a core and a cladding. Preferably, the core is made of a material with a first refractive index and the cladding is made of a material with a second refractive index lower than the first refractive index.

Preferably, the optical printed circuit board also includes a further optical waveguide coupling interface arranged at another end of the optical waveguide for engagement with an external optical device to optically couple the external optical device with the optical waveguide.

In one example, the optical printed circuit board also includes one or more optical waveguides arranged to form an optical waveguide array with the optical waveguide.

The optical printed circuit board may be, for example, a single-layer printed circuit board or a multi-layer printed circuit board.

In accordance with a second aspect of the invention, there is provided a method for fabricating an optical printed circuit board, comprising: arranging a first engagement mechanism on a first printed circuit board portion; attaching one or more second printed circuit board portions to the first printed circuit board portion to form an optical printed circuit board with an optical waveguide coupling interface having the first engagement mechanism; wherein the formed optical printed circuit board further includes: an electrical conductor arranged for conducting electric signal; an optical waveguide arranged for transmitting optical signal; and wherein the optical waveguide coupling interface is arranged at an end of the optical waveguide, the optical waveguide coupling interface being arranged for engagement with an external optical device to optically couple the external optical device with the optical waveguide; and wherein the first engagement mechanism includes: a socket defining a space for receiving with a corresponding plug on the external optical device; or a plug arranged to be received in a corresponding socket on the external optical device. External optical device can be any optical elements, components, apparatus, etc.

Preferably, arranging the first engagement mechanism on the first printed circuit board portion comprises arranging a guide member on the first printed circuit board portion, wherein the guide member defines the socket or the plug.

Preferably, the method also includes forming a recess on a surface of the first printed circuit board portion prior to arranging a guide member on the first printed circuit board portion. The recess is arranged to at least partly receive the guide member. The method may also include arranging the guide member on the first printed circuit board portion comprises arranging the guide member in the recess on the surface of the first printed circuit board portion.

Preferably, the method also includes forming an optical waveguide on the first printed circuit board portion prior to arranging a guide member on the first printed circuit board portion. Forming the optical waveguide on the first printed circuit board portion may involve attaching a cladding portion of the optical waveguide to the surface of the first printed circuit board portion; attaching a core portion of the optical waveguide onto the cladding portion; and attaching a further cladding portion of the optical waveguide onto the core portion.

In one embodiment, the core portion is made of a material with a first refractive index, and the cladding portion and the further cladding portion are made of a material with a second refractive index lower than the first refractive index.

Preferably, attaching the cladding portion to the surface of the first printed circuit board portion comprises: arranging a mold with a surface pattern on the first printed circuit board portion; filling a gap between the mold and the first printed circuit board portion with a material with a first refractive index; heat pressing the mold against the first printed circuit board portion; and curing the material with the first refractive index to form the cladding portion. In one embodiment, the method also includes releasing the mold from the first printed circuit board portion after curing.

In one embodiment, the cladding portion and the further cladding portion define one or more grooves, and the core portion are arranged in the grooves.

The space or the plug may be generally cylindrical. The space or the plug may extend in parallel with a corresponding end portion of the optical waveguide.

The guide member is preferably metallic. In one embodiment, the guide member has a tubular body that defines the socket. In another embodiment, the guide member may have a cylindrical body that defines the plug. The cylindrical body may extend in and projects from the optical printed circuit board.

Preferably, the method also includes laminating the first printed circuit board portion and the one or more second printed circuit board portions.

Preferably, the method also includes processing an end portion of the optical waveguide.

The first printed circuit board portion may include a substrate with an electrical conductor. Each of the one or more second printed circuit board portions may have: a layer of prepreg; a single-layer printed circuit board with prepreg; or a multi-layer printed circuit board with prepreg.

Preferably, the method also includes inserting a test plug into the socket that defines a space for receiving with a corresponding plug on the external optical device; filling a gap between the test plug and the socket with a curable material; and releasing the test plug from the socket after the curable material is cured. Alternatively, or additionally, the method also includes inserting a plug arranged to be received in a corresponding socket on the external optical device into the socket on the optical printed circuit board; filling a gap between the plug and the socket with a curable material; and leaving the plug in the socket after the curable material is cured.

In accordance with a third aspect of the invention, there is provided an optical printed circuit board fabricated using the method of the second aspect.

BRIEF DESCRIPTION OF THE DRAWINGS

Embodiments of the invention will now be described, by way of example, with reference to the accompanying drawings in which.

DETAILED DESCRIPTION OF THE PREFERRED EMBODIMENT

Figure 1:
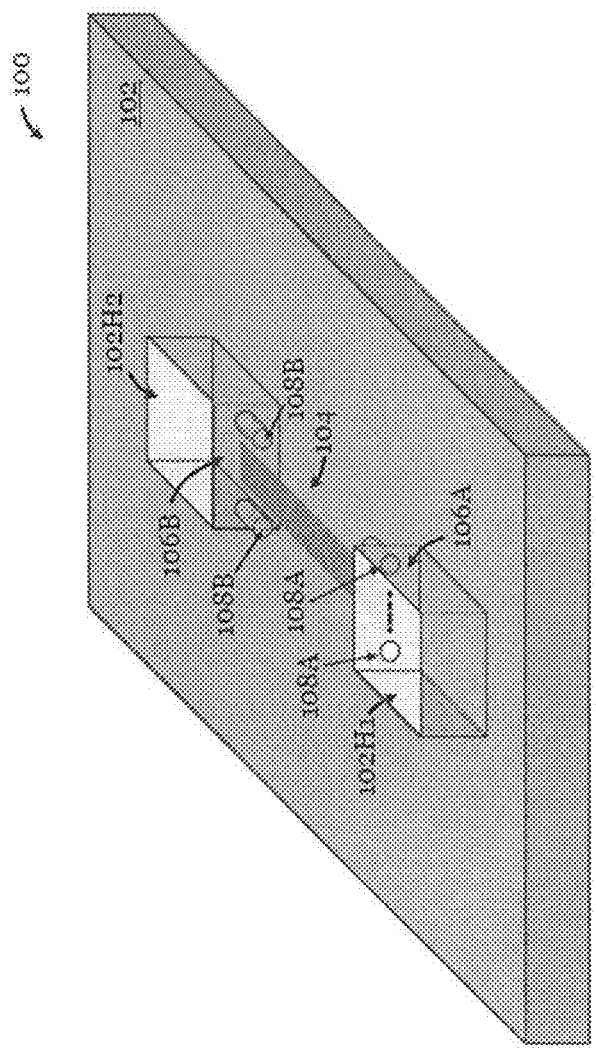
FIG. 1 is a schematic diagram of an optical printed circuit board in one embodiment of the invention.

FIG. 1 shows an optical printed circuit board 100 in one embodiment of the invention. The optical printed circuit board 100 includes a generally rectangular body 102. In this embodiment, the optical printed circuit board 100 includes electrical conductors in the form of copper traces (not shown) for conducting electric signals and optical waveguides 104 for transmitting optical signals. The copper traces can be arranged on or in the body. The optical waveguides 104 each has a core and a cladding and they are arranged in a linear array. In this example, the material of the core has a higher refractive index than the material of the cladding. The optical waveguides 104 are substantially straight and are extending general in parallel with each other.

As shown in FIG. 1, the body 102 has two rectangular holes 102H1, 102H2. Each hole 102H1, 102H2 defines a respective end of the array of optical waveguides 104. An optical waveguide coupling interface 106A, 106B corresponding to the respective ends of the optical waveguides 104 is arranged in the holes 102H1, 102H2. The optical waveguide coupling interface 106A, 106B is for engagement with an external optical device (or component) to optically couple the external optical device with the optical waveguides 104. In this embodiment, each of the optical waveguide coupling interfaces 106A, 106B includes two sockets 108A, 108B each defining a space for receiving with a corresponding plug on the external optical device. The space is generally cylindrical, and extends in parallel with the end portions of the optical waveguides 104. The sockets 108A, 108B are arranged at opposite ends of the optical waveguides 104, with the optical waveguides 140 arranged in between the sockets 108A, 108B. The optical printed circuit board 100 can be applied to chip-to-chip optical interconnect.

Figure 2:
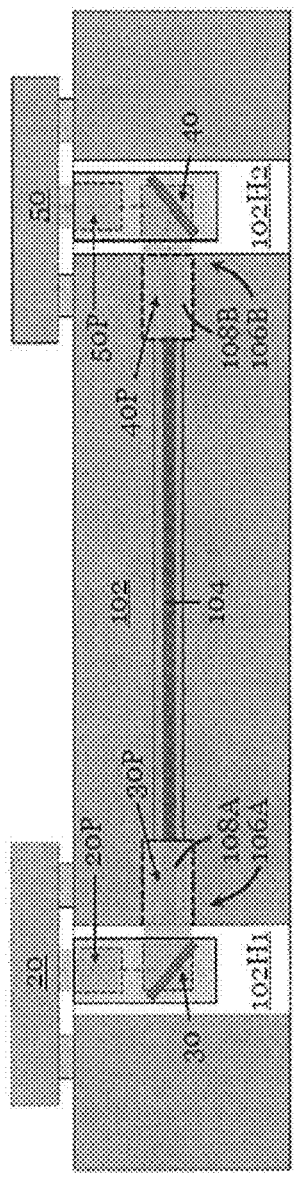
FIG. 2 is a sectional view of the optical printed circuit board of FIG. 1 connected with external optical devices.

FIG. 2 shows a cross section (along a long axis cutting through the two holes) of the optical printed circuit board 100 with external optical devices connected at the two optical waveguide coupling interface 106A, 106B. In FIG. 2, a vertical-cavity surface-emitting laser device 20 with a guide pin 20P is mounted on top of the board 100 at one opening 102H1. An external optical connector 30 incorporating a 90° turning mirror is coupled at the interface 106A. The external optical connector 30 includes a port for receiving the guide pin 20P of the laser device 20, and includes a guide pin 30P for insertion into the socket 108A of the interface 106A. A photo-detector device 50 with a guide pin 50P is mounted on top of the board 100 at the other opening 102H2. An external optical connector 40 incorporating a 90° turning mirror is coupled at the interface 106B. The external optical connector 40 includes a port for receiving the guide pin 50P of the photo-detector device 50, and includes a guide pin 40P for insertion into the socket 108B of the interface 106B. With this arrangement to facilitate alignment, light from the laser device 20 can be coupled accurately into the optical waveguides 104 in the printed circuit board 100, and out to the photo-detector 50, through the mirrors 30, 40.

Figure 3A:
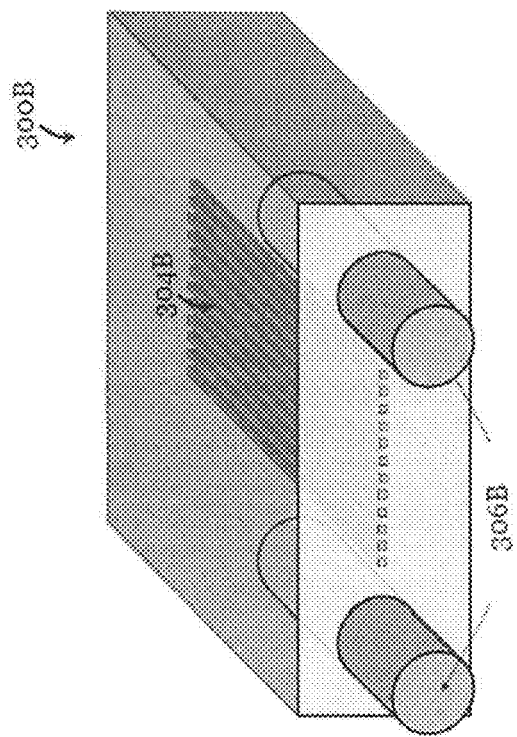
FIG. 3A is a schematic diagram of an optical waveguide coupling interface with a socket in one embodiment of the invention.

FIG. 3A is an enlarged cross-sectional view of an optical waveguide coupling interface 300A in one embodiment. This interface 300A can be applied to the optical printed circuit board 100 of FIG. 1. In this embodiment, the interface 300A includes two sockets arranged at opposite ends of the optical waveguides 304A such that all waveguides 304A are arranged between the sockets. Each socket is defined by a generally cylindrical tubular body 306A arranged inside the body of the printed circuit board. The cylindrical tubular bodies 306A in this example are made of metal. The lateral dimension (diameter measured in parallel to the long axis of the circuit board as shown in FIG. 3A) of the socket (or the bodies 306A) can be much larger, e.g., at least 10 times larger than the lateral dimension (width measure in parallel to the long axis of the circuit board as shown in FIG. 3A) of each waveguide 304A. For example, the waveguide 304A may have a width of 50 μm and the socket (or the body 306A) may have a diameter of >500 μm.

Figure 3B:
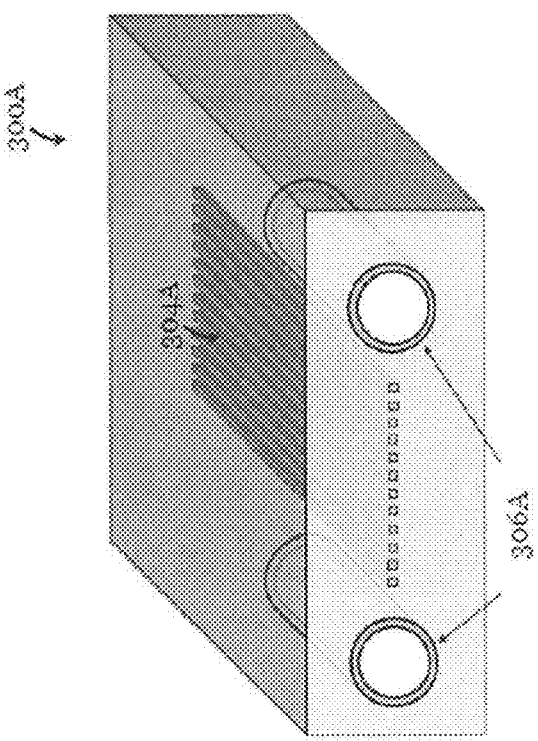
FIG. 3B is a schematic diagram of an optical waveguide coupling interface with a plug in one embodiment of the invention.

FIG. 3B is an enlarged cross-sectional view of an optical waveguide coupling interface 300B in another embodiment. This interface 300B can be applied to the optical printed circuit board of FIG. 1. In this embodiment, the interface 300B includes two plugs arranged at opposite ends of the optical waveguides 304B such that all waveguides 304B are arranged between the plugs. Each plug is defined by a generally cylindrical body or pin 306B that is partly arranged inside the body of the printed circuit board and partly projects from the printed circuit board. The cylindrical pins 306B in this example are made of metal. The lateral dimension (diameter measured in parallel to the long axis of the circuit board as shown in FIG. 3B) of the plug (or cylindrical pin 306B) can be much larger than, e.g., at least 10 times that of, the lateral dimension (width measure in parallel to the long axis of the circuit board as shown in FIG. 3B) of each waveguide 304B. For example, the waveguide 304B may have a width of 50 μm and the plug (or cylindrical pin 306B) may have a diameter of >500 μm.

The following provides a method for fabricating the optical printed circuit board of FIG. 1 in one embodiment of the invention. It should be noted that the method can also be applied to fabricate other optical printed circuit boards. The method can be divided into three main parts: (A) production of a rigid master; (B) production of a soft reusable mold using the master; and (C) production of optical printed circuit board with built-in plug and/or socket using the mold. Significantly, the method in this embodiment allows two structures with significantly different sizes to be formed simultaneously to ensure precise alignment.

(A) Production of a Rigid Master

Figure 4:
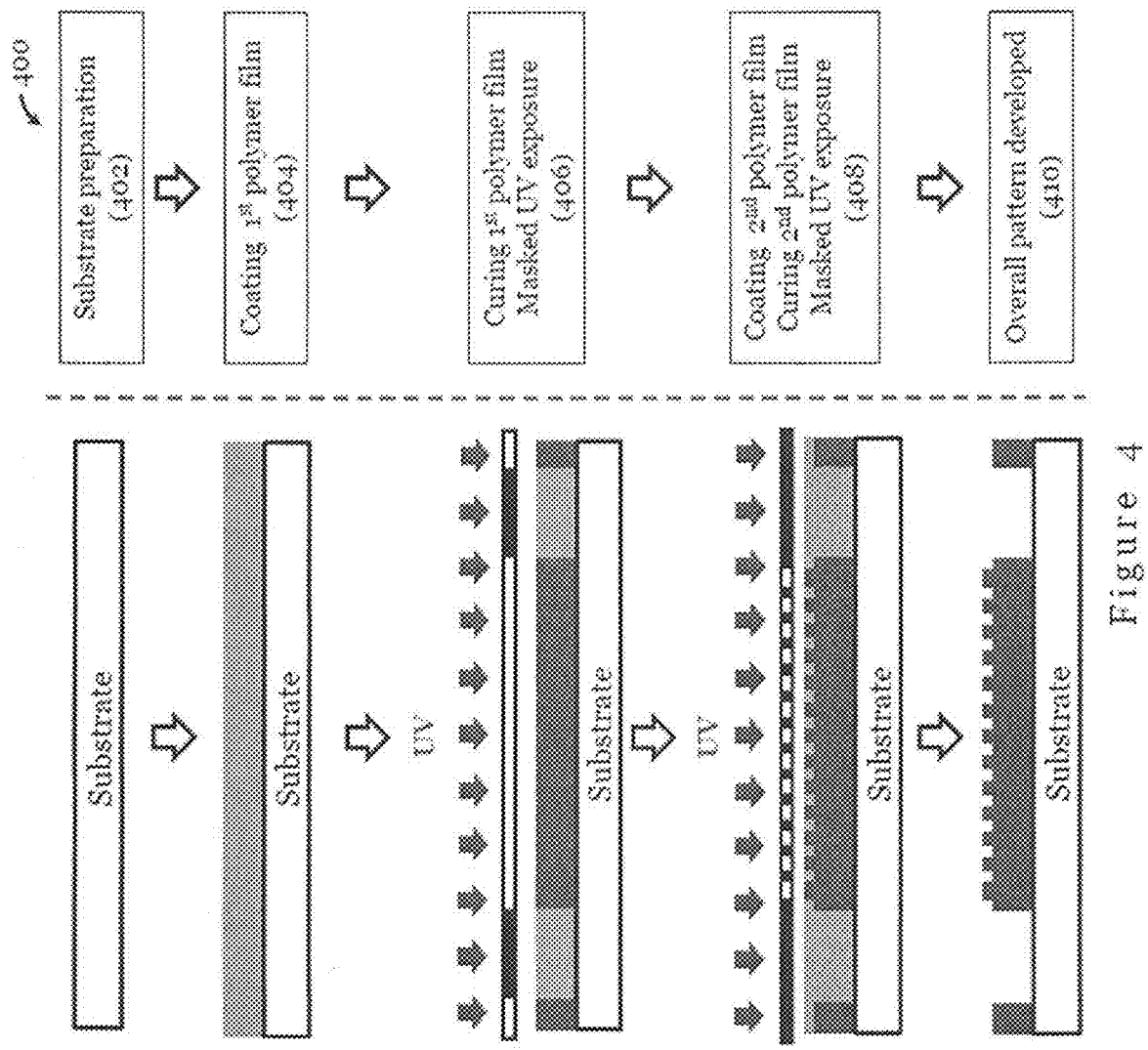
FIG. 4 is a schematic flow diagram illustrating a method for preparing a rigid master for use in the fabrication of the optical printed circuit board of FIG. 1.

FIG. 4 shows a method 400 for preparing a rigid master for use in the fabrication of the optical printed circuit board. The method 400 begins with preparation of a substrate, optionally with cleaning, in step 402. The substrate can be silicon wafer, glass plate, laminate, or any other rigid platform material. Then, in step 404, a first film of polymer is coated on the substrate for photolithographic patterning. This step can be performed using molding, spin-coating, or drawdown coating techniques. The first polymer film can be made of one or more UV-patternable materials, such as EpoClad, EpoCore, photoresist, epoxy, and polyimide. The first polymer film is then cured. In step 406, a mask with two large slits is then placed above the cured polymer film layer. UV light is applied above the mask to shine through the two slits of the mask onto the polymer layer. The width and position of the two large slits on the mask correspond to the position and width (or diameter) of the guide member. Afterwards, in step 408, a second film of polymer is coated on the first polymer layer, and is left to cure. The coating can be performed using molding, spin-coating, or drawdown coating techniques. The second polymer film can be made of one or more UV-patternable materials, such as EpoClad, EpoCore, photoresist, epoxy, and polyimide. Then, another mask with an array of smaller slits then placed above the cured polymer. UV light is applied above the mask to shine through the smaller slits of the mask onto the polymer. The size and position of the smaller slits on the mask correspond to the size and position of the waveguides. In step 410, the overall pattern is developed, leaving behind a rigid master—a substrate with a polymer structure having small multiple grooves and two large rectangular grooves on both sides. Preferably, the large grooves and the smaller grooves are formed with one-step photolithography process.

(B) Production of a Soft Reusable Mold Using the Rigid Master

Figure 5:
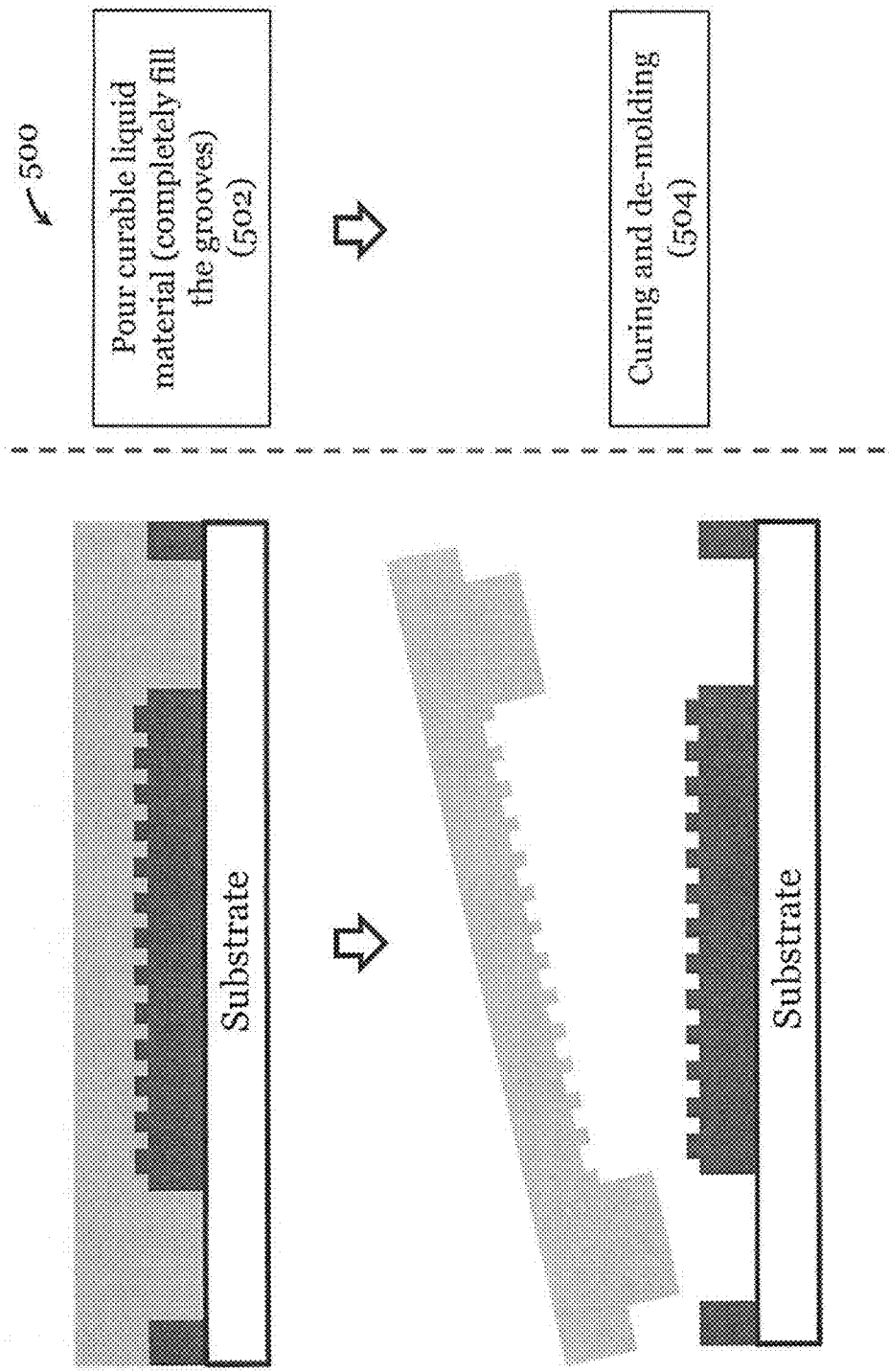
FIG. 5 is a schematic flow diagram illustrating a method for producing a mold for use in the fabrication of the optical printed circuit board of FIG. 1.

FIG. 5 shows a method 500 for producing a mold for use in the fabrication of the optical printed circuit board. The method 500 begins with step 502, in which curable liquid material is poured onto the rigid master to completely fill all the grooves, including the large grooves and the smaller grooves. The material is left to cure. After curing, in step 504, the material is removed from the rigid master. The removed material provides a stand-alone mold. Preferably, the material of the mold is soft and UV transparent, and can be easily removed, e.g., peeled off, from the rigid master. In this embodiment, the mold can be made with Polydimethylsiloxane (PDMS), Teflon, Kapton, or any other soft and non-sticky material.

Figure 6:
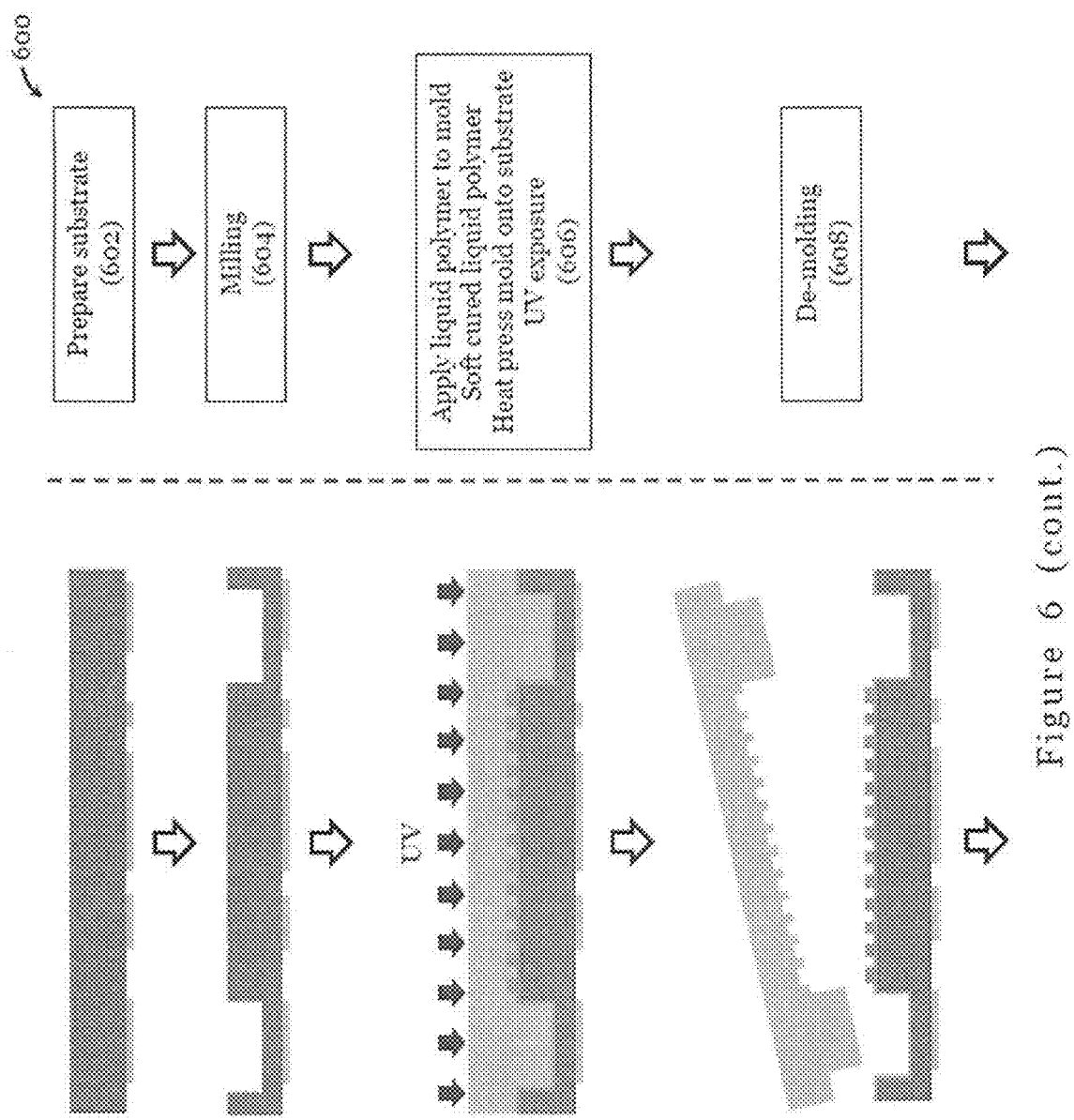
FIG. 6 and FIG. 6 (cont.) provide a schematic flow diagram illustrating a method for fabricating the optical printed circuit board of FIG. 1.
Figure 6:
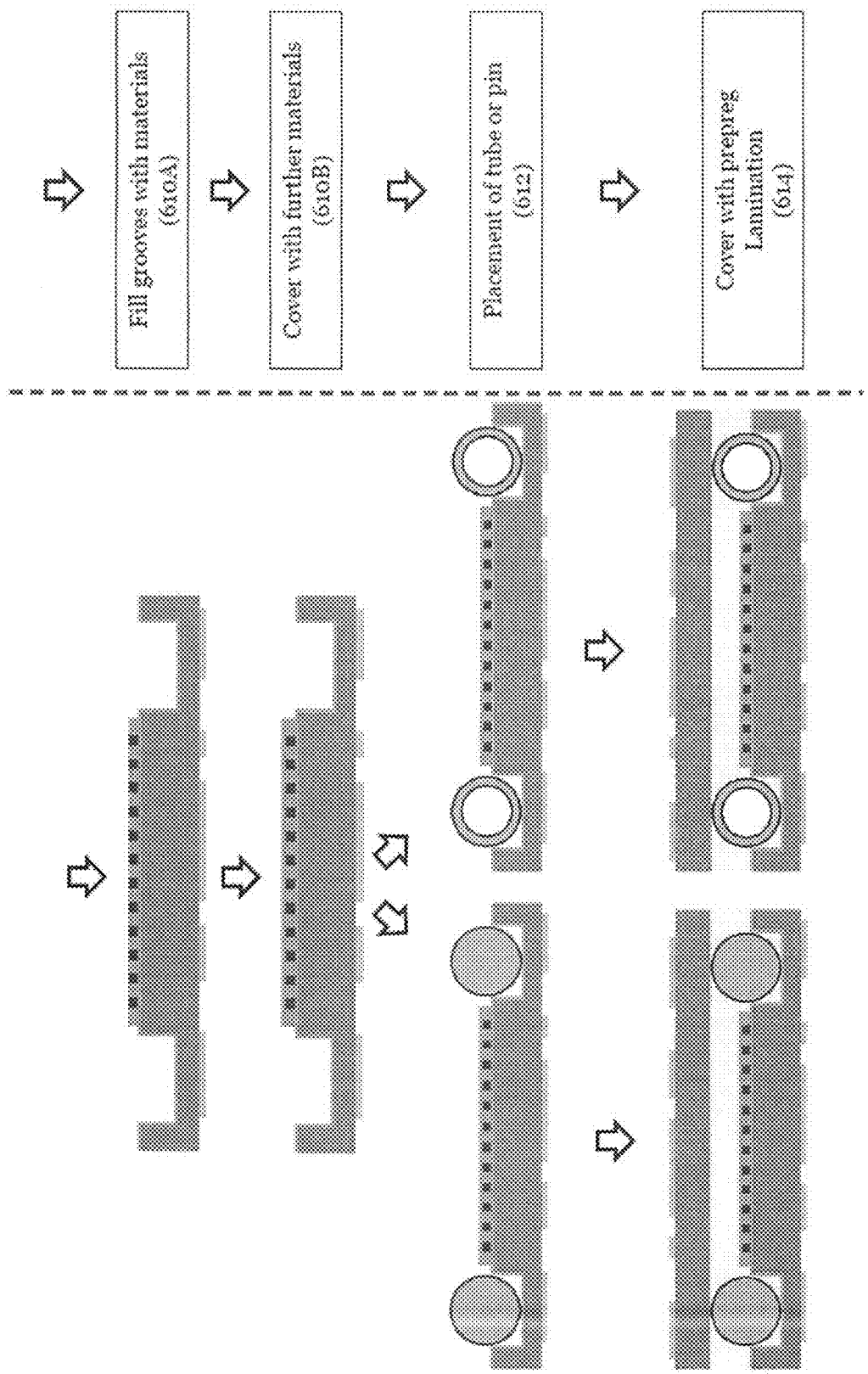

(C) Production of Optical Printed Circuit Board with Built-In Plug and/or Socket Using the Mold FIG. 6 shows a method 600 for fabricating the optical printed circuit board. In step 602, a substrate with copper traces (first printed circuit board portion) is prepared, optionally with cleaning. The substrate with copper traces can be a single layer or multi-layer printed circuit board portion. In step 604, two grooves, generally rectangular, are milled on the substrate. These grooves are arranged for placement of guide members of the socket or plug. The separation between these two grooves is the same as the separation of the two large groves in the rigid master. Preferably, the width and depth of the grooves are slightly large than those of the two these two grooves on the rigid master.

After the grooves are formed, then in step 606, a liquid polymer material with low refractive index is applied to the mold obtained in step 504. The material is then soft cured. Afterwards, the mold with the cured material is pressed onto the grooved substrate with a heat pressing machine. The entire structure is then exposed to UV radiation for further curing, reinforcing the groove structures. In step 608, the mold is removed. After the mold is removed, a material layer that contains the same structures of the rigid master is obtained. The material layer provides the cladding of the waveguides. The material may be, for example, UV-curable or heat-curable material, such as EpoClad, photoresist, epoxy, and polyimide.

In step 610A, the grooves are filled with another material, which is preferably curable. The material may be, for example, UV-curable or heat-curable material, such as Epo- Core, photoresist, epoxy, and polyimide. This material provides the core of the waveguides. Then, in step 610B, after the core material is cured, another layer of material is arranged on the core material, to cover them. This material can be the same as the material layer that provides the grooves. The material may be, for example, UV-curable or heat-curable material, such as EpoClad, photoresist, epoxy, and polyimide. The additional layer of material is then cured. In this embodiment, the material that provides the cladding of the waveguide has a low refractive-index and the material that provides the core of the waveguide has a high refractive-index.

In step 612, guide members, in the form of a cylindrical pin or tube (preferably metallic), can be placed in the large grooves. The guide member preferably has a diameter that is substantially the same as the width of the groove. Afterwards placing the pin or tube in the groove, the method proceeds to step 614. In step 614, the entire structure with pin or tube is covered with a second printed circuit board portion with sufficient thickness. The second printed circuit board portion may include a single PCB core with prepreg, a multi-layer PCB with prepreg, or prepreg only. Lamination is then performed, with heat and pressure applied in cycles (similar to conventional PCB manufacturing process) between the two printed circuit board portions. Optionally, the ends of the waveguides are further routed and polished.

Figure 7A:
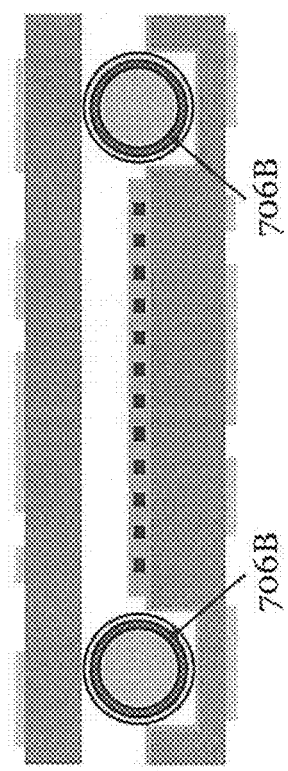
FIG. 7A is a schematic diagram of an optical waveguide coupling interface with a socket in one embodiment of the invention.
Figure 7B:
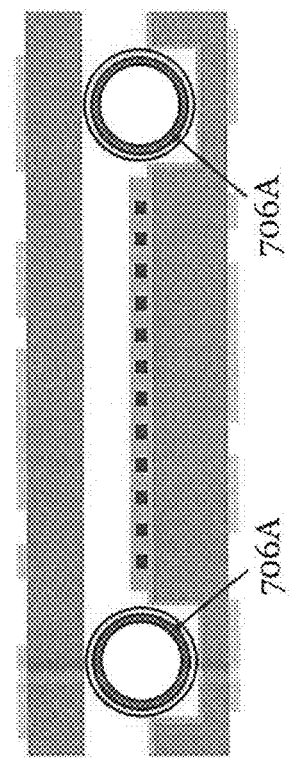
FIG. 7B is a schematic diagram of an optical waveguide coupling interface with a plug in one embodiment of the invention.

In some embodiments, it may be necessary to adjust the sockets or plugs formed to account for structural and manufacture tolerances, e.g., uncertainties in the dimensions of the guide members used and misalignment caused by the fabrication process. In one embodiment, for interface formed with a socket, a guide pin is placed in the space of the socket, and a curable material is filled in gap between the guide pin and the socket. An active alignment procedure is simultaneously applied to optimize the position of the guide pin. The curable material may be self-curable material at room temperature, such as PDMS. After the filled material is cured, the guide pin can be removed from the tubes to form a guide hole socket 706A, as shown in FIG. 7A, or the guide pin can remain in the tube to form a guide pin plug 706B, as shown in FIG. 7B.

In one example, the active alignment process includes: (1) plugging two standard MT ferrules with removable guide pins to the metal tubes; (2) filling the gap between the guide pins of the MT ferrules and the metal tubes with a curable material; (3) coupling light into the waveguides at one end and collecting light from the waveguides at the other end through the two standard MT ferrules; (4) finely adjusting the positions of the guide pins of the MT ferrules inside the metal tubes until maximum light output from the waveguides is obtained; (5) curing the curable material to fix the optimal positions of the guide pins of the MT ferrules inside the metal tubes; and (6) removing the MT ferrule together with the guide pins from the metal tubes to form the guide-hole socket (FIG. 7A) or removing only the MT ferrule from the metal tubes while leaving the guide pins in the tubes to form a guide-pin socket (FIG. 7B).

The above embodiments of the invention has provided an optical printed circuit board incorporating robust optical coupling interface with plug or socket to facilitate connection with external optical components terminated with standard connectors. The board can greatly reduce connection cost and provide an effective solution for chip-to-chip optical interconnection required for high-speed data transmission applications. The above embodiments of the invention has provided a method for fabricating optical printed circuit board incorporating robust optical coupling interface with plug or socket. The method is cost effective and can be readily applied as it is compatible with existing PCB manufacturing technology. In some embodiment, the fabrication process is a low-cost one-step stamping process, which is compatible with existing PCB manufacturing process. The method allows well-aligned connector sockets (in the form of guide-holes/pins) to be formed simultaneously together with embedded waveguides. The resultant circuit board allows direct coupling to existing photonics components (such as transceivers) that incorporate standard connectors. The present invention has the potential to be developed into a low-cost manufacturing process for mass production of optical printed circuit boards.

It will be appreciated by persons skilled in the art that numerous variations and/or modifications may be made to the invention as shown in the specific embodiments without departing from the spirit or scope of the invention as broadly described. The described embodiments of the invention should therefore be considered in all respects as illustrative, not restrictive.

For example, the optical printed circuit board incorporating the optical waveguide coupling interface can be single-layer printed circuit board or a multi-layer printed circuit board. The optical printed circuit board can take any shape and form, and may include any number of electrical conductors arranged for conducting electric signal and optical waveguides arranged for transmitting optical signal. The electrical conductors are preferably metallic, for example copper. The electrical conductors can be arranged on the board or in the board. The optical waveguides can have core and cladding. The refractive index of core and cladding can be freely chosen to suit different applications. The optical waveguides are preferably embedded in the board. The optical waveguides need not be straight but can include bends and junctions as needed. The optical printed circuit board can include any number of optical waveguide coupling interfaces, arranged at any position (not necessary in a hole of the body of the board but, for example, can be at an end face of the body), corresponding to the ends of the optical waveguides. The optical waveguide coupling interface can have any number of socket or plug, of any shape. The optical waveguide coupling interface can include only plugs, only sockets, or a combination of both. The socket and/or plug on the same interface can be connected to the same external optical device, or with respective external optical devices. Guide members that form the socket and plug can be correspondingly shaped, and can be made of any materials such as but not limited to metal. Also, for example, the method for fabricating the optical printed circuit board can be re-ordered, and can include less or additional steps.

The invention claimed is:

1. An optical printed circuit board, comprising:
 an electrical conductor arranged for conducting electric signal;
 an optical waveguide arranged for transmitting optical signal; and
 an optical waveguide coupling interface arranged at an end of the optical waveguide, the optical waveguide coupling interface being arranged for engagement with an external optical device to optically couple the external optical device with the optical waveguide;
 wherein the optical waveguide coupling interface comprises an engagement mechanism with:
  a socket defining a space for receiving with a corresponding plug on the external optical device, the space extending in parallel with a corresponding end portion of the optical waveguide; or a plug arranged to be received in a corresponding socket on the external optical device, the plug extending in parallel with a corresponding end portion of the optical waveguide.

2. The optical printed circuit board of claim 1, wherein the space or the plug is generally cylindrical.

3. The optical printed circuit board of claim 1, wherein the optical waveguide coupling interface comprises a guide member for defining the socket or the plug.

4. The optical printed circuit board of claim 3, wherein the guide member has a tubular body that defines the socket.

5. The optical printed circuit board of claim 4, wherein the tubular body extends in the optical printed circuit board.

6. The optical printed circuit board of claim 4, wherein the tubular body is metallic.

7. The optical printed circuit board of claim 3, wherein the guide member has a cylindrical body that defines the plug.

8. The optical printed circuit board of claim 7, wherein the cylindrical body extends in and projects from the optical printed circuit board.

9. The optical printed circuit board of claim 7, wherein the cylindrical body is metallic.

10. The optical printed circuit board of claim 1, wherein the engagement mechanism is a first engagement mechanism, and wherein the optical waveguide coupling interface further comprises a second engagement mechanism with:
a further socket defining a space for receiving with a corresponding plug on the external optical device; or
a further plug arranged to be received in a corresponding socket on the external optical device.

11. The optical printed circuit board of claim 10, wherein the first engagement mechanism and the second engagement mechanism are arranged on opposite sides of the optical waveguide.

12. The optical printed circuit board of claim 1, wherein the optical printed circuit board includes a body; the electrical conductor is arranged on or in the body; and the optical waveguide is embedded in the body.

13. The optical printed circuit board of claim 12, wherein the body includes a hole and the optical waveguide coupling interface is arranged in the hole.

14. The optical printed circuit board of claim 1, wherein the optical waveguide comprises a core and a cladding, wherein the core is made of a material with a first refractive index and the cladding is made of a material with a second refractive index lower than the first refractive index.

15. The optical printed circuit board of claim 1, further comprising a further optical waveguide coupling interface arranged at another end of the optical waveguide for engagement with an external optical device to optically couple the external optical device with the optical waveguide.

16. The optical printed circuit board of claim 1, further comprising one or more optical waveguides arranged to form an optical waveguide array with the optical waveguide.

17. The optical printed circuit board of claim 1, wherein the optical printed circuit board is a single-layer printed circuit board.

18. The optical printed circuit board of claim 1, wherein the optical printed circuit board is a multi-layer printed circuit board.

19. An optical printed circuit board, comprising:
an electrical conductor arranged for conducting an electric signal;
an optical waveguide arranged for transmitting an optical signal; and
an optical waveguide coupling interface arranged at an end of the optical waveguide, the optical waveguide coupling interface being arranged for engagement with an external optical device to optically couple the external optical device with the optical waveguide; wherein the optical waveguide coupling interface comprises an engagement mechanism, the engagement mechanism comprises a guide member with a tubular body that defines a socket, the socket defines a space for receiving with a corresponding plug on the external optical device.

20. The optical printed circuit board of claim 19, wherein the tubular body extends in the optical printed circuit board.

21. The optical printed circuit board of claim 19, wherein the tubular body is metallic.

22. The optical printed circuit board of claim 19, wherein the optical printed circuit board is a single-layer printed circuit board.

23. An optical printed circuit board, comprising:
an electrical conductor arranged for conducting electric signal;
an optical waveguide arranged for transmitting optical signal; and
an optical waveguide coupling interface arranged at an end of the optical waveguide, the optical waveguide coupling interface being arranged for engagement with an external optical device to optically couple the external optical device with the optical waveguide; wherein the optical waveguide coupling interface comprises an engagement mechanism, the engagement mechanism comprises a guide member with a cylindrical body that defines a plug, the plug is arranged to be received in a corresponding socket on the external optical device.

24. The optical printed circuit board of claim 23, wherein the cylindrical body extends in and projects from the optical printed circuit board.

25. The optical printed circuit board of claim 23, wherein the cylindrical body is metallic.

26. The optical printed circuit board of claim 23, wherein the optical printed circuit board is a single-layer printed circuit board.

27. An optical printed circuit board, comprising:
an electrical conductor arranged for conducting electric signal;
an optical waveguide arranged for transmitting optical signal; and
an optical waveguide coupling interface arranged at an end of the optical waveguide, the optical waveguide coupling interface being arranged for engagement with an external optical device to optically couple the external optical device with the optical waveguide; wherein the optical waveguide coupling interface comprises an engagement mechanism with:
a socket defining a space for receiving with a corresponding plug on the external optical device; or
a plug arranged to be received in a corresponding socket on the external optical device; wherein the optical printed circuit board is a single-layer printed circuit board.

* * * * *